United States Patent [19]

Dingwall

[11] Patent Number: 5,023,613
[45] Date of Patent: Jun. 11, 1991

[54] DECODER ERROR PREVENTION APPARATUS FOR USE IN FLASH ANALOG-TO-DIGITAL CONVERTERS

[75] Inventor: Andrew G. F. Dingwall, Princeton Township, Mercer County, N.J.

[73] Assignee: Harris Semiconductor Patents, Inc., Melbourne, Fla.

[21] Appl. No.: 176,323

[22] Filed: Mar. 31, 1988

[51] Int. Cl.$^5$ .............................................. H03M 1/06
[52] U.S. Cl. ..................................... 341/118; 341/159
[58] Field of Search ................. 341/118, 120, 159, 160

[56] References Cited

U.S. PATENT DOCUMENTS 4,591,825  5/1986  Bucklen ............................... 341/159
4,774,498  9/1988  Traa .................................... 341/159

Primary Examiner—William M. Shoop, Jr.
Assistant Examiner—Marc S. Hoff
Attorney, Agent, or Firm—Henry I. Schanzer

[57] ABSTRACT

There is disclosed a decoder configuration for a high-speed flash-type analog-to-digital converter which utilizes a plurality of comparators arranged from a first lower order comparator to a last high order comparator based on the particular position of each comparator as coupled to taps of a reference resistance ladder. The measurement point in such a system can be logically decoded by establishing the tap where all comparators below it are low and ideally all comparators above the tap are high. This is implemented in a decoding scheme which implements the test by testing all combinations of three adjacent comparators so that the selected tap is high and the taps immediately above and below it are high and low respectively to therefore detect an HHL sequence. In regard to the present invention, there are included means which will prevent a higher order HHL sequence from appearing when a lower order HHL sequence is detected. In this manner by inhibiting a higher state reading with a lower state reading, one can prevent serious errors which would undesirably cause a "sparkle" in the decoded output signal.

18 Claims, 3 Drawing Sheets

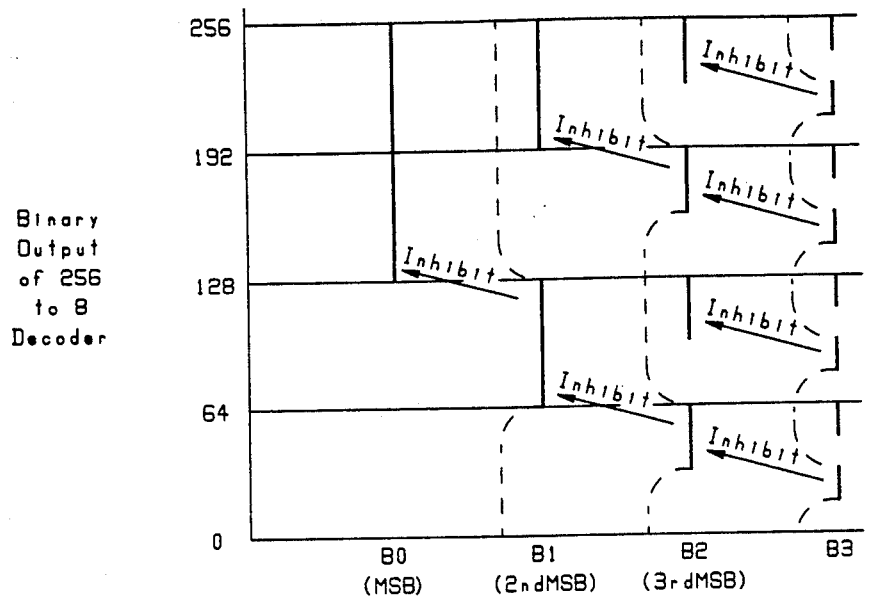

FIG. 2

| COMPARATOR LOCATION ON INTERGRATED CIRCUIT | | Permissible Range of Bits COMPARATOR OUTPUT PATTERNS AND RESULTANT OUTPUT (S) SELECTED AFTER TESTING ALL ADJACENT GROUPS OF THREE COMPARATORS FOR "H H L" PATTERN | | | |
|---|---|---|---|---|---|
| DECIMAL | BINARY | EXAMPLE 1 | EXAMPLE 2 | EXAMPLE 3 | EXAMPLE 4 |
| 132 | 1000 0100 | H | H | H | H |
| 131 | 1000 0011 | H | H | H ◄ | H |
| 130 | 1000 0010 | H | H | L | H ◄ |
| 129 | 1000 0001 | H | H | H | L |
| 128 | 1000 0000 | H | H ◄ | H ◄ | H |
| 127 | 0111 1111 | H ◄ | L | L | H ◄ |
| 126 | 0111 1110 | L | L | L | L |
| DECODING STATUS | | NORMAL | NORMAL | WRONG | SERIOUSLY-WRONG |
| DECODED OUTPUT (S) | | 0111 1111 | 1000 0000 | 1000 0011 1000 0000 | 1000 0010 0111 1111 |
| NET EFFECT (BINARY) (DECIMAL) | | 0111 1111 127 | 0111 1111 128 | 0111 1111 131 | 1111 1111 255 |
| DECODING PRODUCED BY USING ERROR PREVENTION LOGIC | | 127 | 128 | 131 | 127 |

FIG. 3

DECODER ERROR PREVENTION APPARATUS FOR USE IN FLASH ANALOG-TO-DIGITAL CONVERTERS

BACKGROUND OF THE INVENTION

This invention relates to flash-type analog-to-digital (A/D) converters in general and more particularly to a decoder apparatus for error prevention in such converters.

As is well known, flash-type A/D converters also referred to as parallel converters or simultaneous A/D converters are widely employed to develop ultra-fast conversions which are of the type for example required in video signal processing, radar applications and other applications as well.

Such converters employ an analog comparator for every quantization level in the coded digital word. Since the conversion is performed in one step, rates of 100 megabits per second can be achieved. However, because the amount of equipment needed is practically doubled for each additional binary bit of resolution, parallel converters are usually employed with a requirement for low resolution that is a high speed 3-to-8 bit conversion system.

A limitation of the method in parallel converters is the large number of comparators required even for moderate resolution. Such large numbers of comparators have been provided in the prior art using CMOS technology with large scale integrated circuits. For example, a 4-bit converter requires only 15 comparators but an 8-bit converter needs 255 comparators. Hence the prior art has employed many techniques in order to improve operation of such parallel converters. For examples of typical devices, reference is made to a text entitled "Analog-To-Digital/Digital-To-Analog Conversion Techniques" by David F. Hoeschele, Jr., published by John Wiley & Sons, Inc. 1968 (See Chapter 12 entitled "Analog-To-Digital Converter Design", pages 366 to 429. There are of course many other examples of flash analog-to-digital converters in the prior art.

As is indicated, in the flash analog-to-digital converter whether it be fabricated from CMOS technology or otherwise certain errors can occur at specific sampling frequencies and input bandwidth. For example, in a high-speed CMOS 8-bit flash converter analog-to-digital measurement is made by comparing an input signal applied to 255 separate comparators each of which compare the input signal against 255 separate taps on a reference resistance ladder. The measurement point ideally can be logically decoded by establishing a tap where all comparisons below the tap are low (L), and ideally all above are high (H). This is approximated in a practical 256-to-8 decoding scheme based on testing all combinations of three adjacent comparators so that the selected tap is high and the taps immediately above and below it are high and low respectively (i.e. HHL sequence). It is also noted that more complicated sequences as for example HHLL can lead to non-correctable errors when a mistake is made. In this case, the sequence HHLHLL would not decode for an error one bit away from ideal. The HHL sequence always decodes and ensures that the error must be two bits away.

The basic problem has been that if the input signal is slewing rapidly, infrequent mistakes at isolated comparators can occur so that more than one measurement point will be decoded as the logical OR of the two measurements. Although such erroneous measurements occur near the true value, they can decode to non-serious errors or serious errors. A serious error would be a full scale output for near mid-point inputs. These are obviously unacceptable.

It is therefore an object of the present invention to provide a decoding method whereby serious ORing errors are rejected based on inhibiting an incorrect reading.

It is a further object to provide an improved decoder configuration for error prevention in a flash-type high-speed analog-to-digital converter.

BRIEF DESCRIPTION OF THE FIGURES

FIG. 2 is a Table showing the permissible range of bits utilized in accordance with the teachings of this invention.

FIG. 3 is a Table giving particular examples on how errors can occur in decoded outputs based on sensing an HHL pattern for a point of match in a flash-type analog-to-digital converter.

Figure 1:
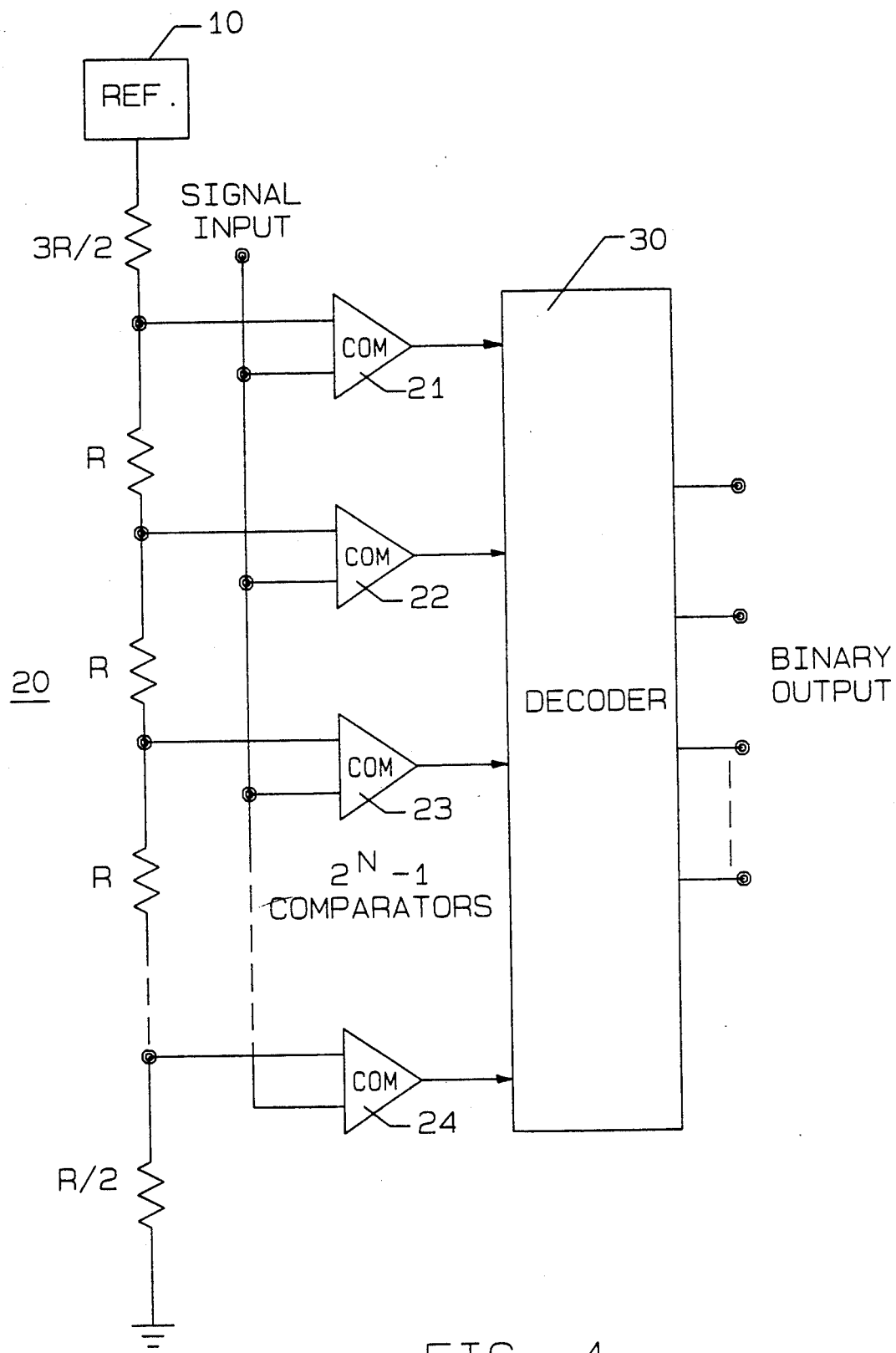
FIG. 1 is simple block diagram useful in explaining the operation and structure of a flash-type analog-to-digital converter according to this invention.

Before proceeding with a description of the present invention, reference is made to FIG. 1 where there is shown a simple block diagram depicting a flash- or parallel-type converter as of the type employed in the prior art. The Figure is useful in describing and understanding the invention as pertaining to the apparatus herein. As one can see from FIG. 1, the flash- or simultaneous- or parallel-type analog-to-digital converter employs a source of reference potential 10. The source of reference potential 10 is coupled to ground or a point of reference potential via a reference resistor chain or ladder 20. As seen, each of the resistors in the ladder is monitored by a comparator as comparators 21 to 24. It is of course understood by means of the dashed lines shown in FIG. 1 that the analog-to-digital converter apparatus employs a plurality of such comparators, and as indicated above, an 8-bit unit would employ for example 255 such comparators. The comparators are arranged from a low order comparator as 24 to a highest order comparator as 21. Hence comparator 21 would decode the equivalent of decimal 255, while comparator 24 decodes the equivalent of decimal 0. Depending on the logic, the order can be reversed.

In any event, the outputs of the comparators are respectively coupled to a decoder circuit 30 which circuit operates to decode the comparator outputs to provide a binary output suitable for utilization by typical digital processing circuits. The operation of the circuit in FIG. 1 is as follows. It is understood that the analog-to-digital converter employs $2^n - 1$ analog comparator such as 21 to 24 to directly implement the quantizer transfer function of an analog-to-digital converter. The comparator trip points are spaced 1 LSB (least significant bit) apart by the series resistance ladder 20 as coupled to the voltage reference source 10.

For a given analog input voltage designated by signal input, all comparators biased below the signal voltage level turn-on and those biased above the level remain in the off condition. Since all comparators as 21 and 24 change states simultaneously, the quantization process is a one-step operation. In any event, a second step is required since the logic output of the comparator is not normally in binary form. Therefore, an ultra-fast decoder circuit 30 is employed to make a logical conversion to a suitable binary code. The parallel technique as indicated reaches the ultimate in high speed operation because only two sequential operations are required to make the conversion.

As indicated above and shown in the prior art, the limitation however is the large number of comparators required for even moderate resolutions. In regard to this, it is common practice to implement an 8-bit analog-to-digital converter with two 4-bit stages which essentially operate in series. Such configurations operate so that the result of the first 4-bit conversion is converted back to analog by means of an ultra-fast 4-bit digital-to-analog converter and subtracted from the analog input. The resulting residue is then converted by the second 4-bit analog-to-digital converter and the two sets of data are accumulated in 8-bit output register. Converters of the above described type which is a 2-stage parallel 8-bit analog-to-digital converter achieves such conversions at rates of 20 MHz and higher or single-stage 4-bit conversions can reach 100 MHz or higher.

In any event, as indicated above, such comparators having 8-bit resolutions as for example as the type shown in FIG. 1 have been implemented by CMOS technology and there are many examples of such comparators exiting in the prior art as supplied by many companies including the assignee herein.

As indicated above, a basic problem with a high-speed flash-type converter is that if the input or signal input is slewing rapidly infrequent mistakes at isolated comparators can occur so that more than one measurement point will be decoded. Although such erroneous measurements occur near the true value, they can decode to non-serious errors or serious errors. Serious errors are unacceptable. The errors are due to the fact that some comparators may be different in characteristics than others and hence do not track. With a fast slewing signal which is sampled by a pulse having a finite width more than one comparator can provide an output as a function of the slewing rate. This may be decoded as a serious error and cause a "sparkle" condition.

Referring to FIG. 3, there is shown a table which illustrates several examples of correct and incorrect readings. As one can see from FIG. 3, the left-most column is entitled "Comparator Location on Integrated Circuit". The decimal numbers stand for the comparator which would be one of the 256 comparators employed in such a flash-type converter. Hence as one can see from FIG. 3, the left-most column is entitled "Decimal" and has the numbers 126 to 132 included therein. These numbers represent the position of a comparator in the chain of comparators. Hence comparator 126 would be the 126th comparator in the chain while comparator 132 would be the 132nd in the chain. Adjacent to the column labeled "Decimal" is a column labeled "Binary" whereby the equivalent binary numbers for each of the comparators is given. At the right side there is a series of indications designated by "H" for "High" and "L" for "Low". This represents comparator output patterns and the resultant output (shown by arrow) which is selected after testing all adjacent groups of three comparators for the HHL pattern. It is thus understood that Table 3 gives examples of decoded outputs based on sensing the HHL pattern for a point of match in a flash-type analog-to-digital converter.

As one can ascertain from FIG. 3, there are given four examples and as will be explained, two of these examples depict exactly how an error can occur. For example 1, the desired output would occur at comparator 127 which is high as comparator 128 above or adjacent to comparator 127 is also high as comparator 126 below or adjacent again to comparator 126 is low. Therefore, the testing of the HHL pattern as shown in example 1 produces a decoded output which is binary 0111 1111 or decimal 127. This is a correct output and is indicated as being correct. In example 2, there is shown the condition where comparator 128 would be high while comparator 129 above and adjacent to 128 is also high and comparator 127 below and adjacent to 128 is low. Therefore, the detection of the HHL pattern produces the binary number 1000 0000. This again is decoded to decimal 128 which is the correct value.

In regard to example 3, there is shown a condition which could occur when the input signal is rapidly slewing as indicated. As one can see from example 3, comparator 131 is high while comparator 132 adjacent and above comparator 131 is also high while comparator 130 below comparator 131 is low. Hence the output from comparator 131 is considered to be a proper condition which is equivalent to binary 131. In any event, it is also seen that comparator 128 is high while comparator 129 above is also high and comparator 127 below is low. Therefore, the output of comparator 128 also appears to be a true condition. Hence as will be explained, when the outputs of comparators 131 and 128 are ORed, one produces a decode of 131 which is incorrect.

However, the decode of 131 is not a serious error as the proper decoding in the above example would be a decoding of 130. In any event, referring to example 4, there is shown a condition where multiple decoding of 1000 0010 (130) plus 0111 1111 (127) previously decoded incorrectly to 1111111 which is 255. This is a serious error as the comparator decodes a value of 130 as being 255. In any event, based on the apparatus to be described, this would be decoded as 0111 1111 or 127 which is acceptable. As shown in FIG. 3, the decoding produced by using the error prevention logic according to this invention produces the numbers shown in the table of FIG. 3. In example 3, both this apparatus and the prior art apparatus would decode 131 which would only be off by the factor of 1 in lieu of 130. In any event, the apparatus according to this invention would prevent a decode of 255 but would decode the situation shown in example 4 as 127 which is a useable value.

Referring to FIG. 2, there is shown a chart which essentially depicts the permissible range of bits which can occur according to this invention. In FIG. 2 the chart illustrates that for 50 percent of the occurrences of each non-MSB, non-most significant bit, (i.e. bits in the ranges tied with dotted lines) it is not permissible for the next higher bit to be simultaneously high assuming the true value occurs nearby. Thus when any of these inhibiting bits is high, this state operates to inhibit a high on the next higher bit which must be in error. As one can see from FIG. 2, it is noted that near input values of 128, it is an inpermissible binary combination for the MSB, B0, and the second MSB, B1, to be high at the same time. In fact, B0 and B1 can only both be high for inputs 192 or higher. Thus if decoded B1 outputs are split into two ranges as shown in FIG. 2, when the B1 line corresponding to counts in the 64 to 127 range is high, it can be used to inhibit automatically the MSB, B0, thereby avoiding errors.

In a similar manner, the third MSB, B2, can inhibit B1 against errors and so forth. It is immediately noted that the correction and practice inhibits only a single higher bit (i.e. no ripple carry) so that the process is quite fast. Once the decoder has been configured so that noninhibiting lines $B_{NON}$, and inhibiting lines, $B_{INH}$ are available for a series of bits, the desired output, $B_{OUT}$ can be implemented in logic by the following equation.

$$B_{OUT}(n) = [B_{NON}(n) + B_{INH}(n)] \cdot B_{INH}(n-1)$$

Where n equals the number of the bit in accordance with the MSB position.

Thus it can be ascertained by referring to FIG. 2, there is shown a schematic illustration of the invention which thereby indicates permissible locations of high outputs for the most significant bits of the decoder. Hence by splitting the comparator outputs into "inhibiting" and "noninhibiting" sections, local errors which will cause inpermissible occurrence of higher order bits can be inhibited. Thus the chart in FIG. 2 basically illustrates the nature and operation of the invention which essentially operates to split decoder outputs in inhibiting and non-inhibiting sections and therefore using the inhibiting bits when in a high condition to inhibit a high on the next high bit which must be in error.

Figure 4:
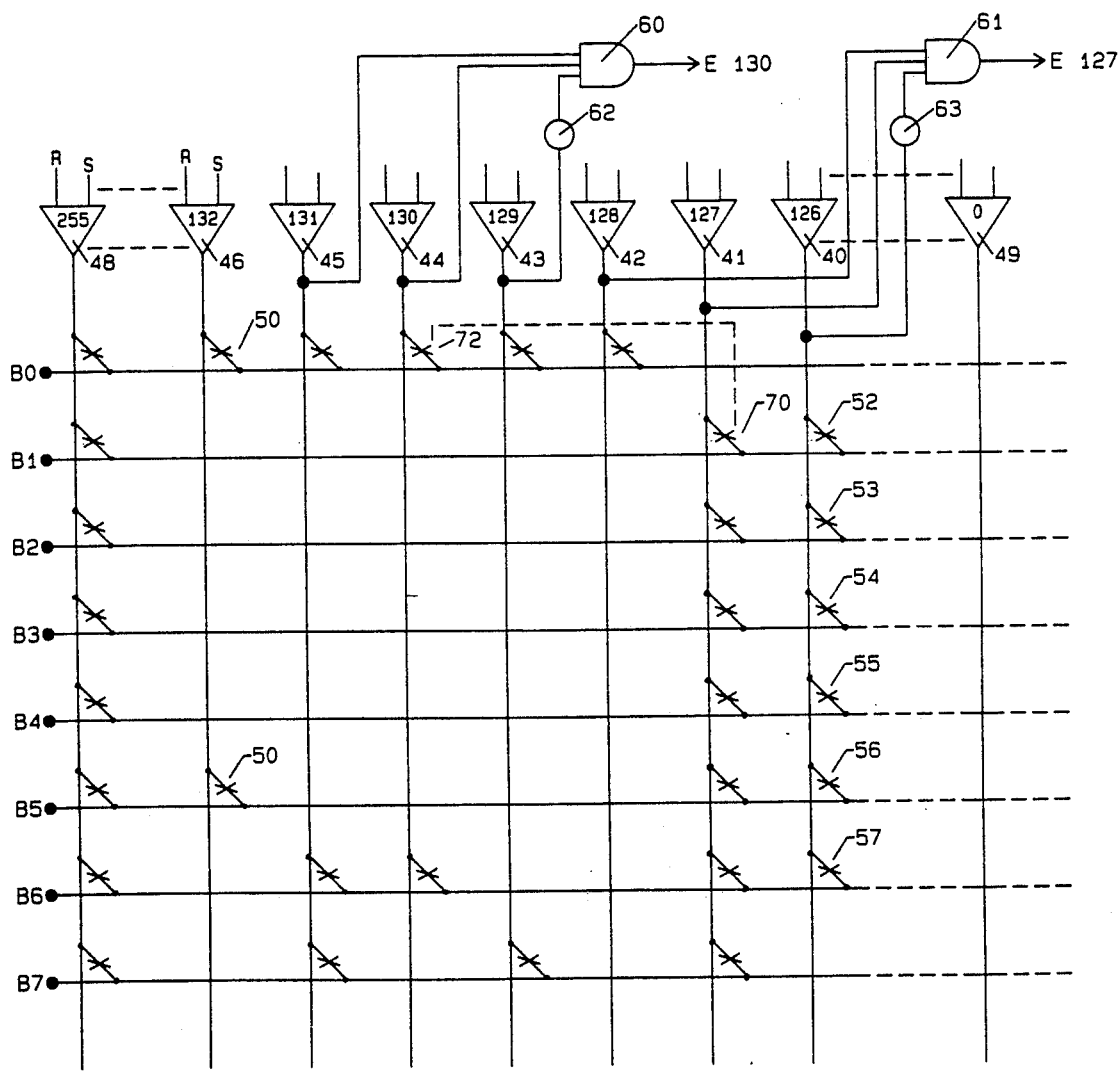
FIG. 4 is a schematic diagram showing typical decoding techniques employed in such flash-type analog-to-digital converters and useful for explaining the principles and structure of this invention.

Referring to FIG. 4, there is shown a schematic diagram which will enable one to more clearly understand the nature of the above-noted invention. As seen in FIG. 4, the same exact Table as in FIG. 3 is included in the upper left-hand side of the drawing. Essentially, comparators 126 to 132 are indicated with their decimal value indicative of the position of the comparator in the chain and with the binary equivalent shown in the Table. It is noted that $B_0$ is the most significant bit while $B_7$ is the least significant bit. The weighted values of each of the positions of the various binary values are also shown in the Table.

Referring to the schematic, there is shown the plurality of comparators 126 to 132 designated as 41 through 46 respectively with comparator 126 designated by reference numeral 40 and comparator 132 designated by reference number 46. Also shown is comparator 255 designated by reference numeral 48 and comparator 0 designated by numeral 49. As can be seen from FIG. 4, the decoded binary states designated by B0 to B7 are shown on the left side of the drawing.

As seen from FIG. 4, each of the comparators as for example 40 to 49 have their outputs coupled to a matrix array so that the comparator 46 (132) when its output goes high operates two FET devices such as devices 50 and 51 thereby causing lines B0 and B5 to go high indicative of the decimal output of 132. In a similar manner comparator 40 which decodes 126 operates field effect devices as for example 52, 53, 54, 55, 56 and 57 to cause the associated B output lines to go high when comparator 126 provides an output. As indicated above, if an input signal is rapidly slewing, the comparators can provide a condition where two outputs are indicated simultaneously as shown in example 4 of FIG. 3. As noted from example 4 of FIG. 3, one can ascertain that comparators 131, 130 and 129 exhibit the HHL condition while comparators 128, 127, and 126 also exhibit the HHL condition. For this condition, one will immediately ascertain that due to the fact that comparator 130 would be selected as well as comparator 127 then the output would be indicated as all ones due to the closure of the various FET switches coupled to the outputs of the selected comparators. This is clearly shown in FIG. 4.

In any event, as also shown in FIG. 4, each of three comparator groups is monitored by a typical 3-input NAND gate as gates 60 and 61. As one will ascertain, gate 60 monitors the output of comparator 131, comparator 130 and via a inverter 62 the comparator output 129. In a similar manner gate 61 monitors the output of comparator 128, comparator 127 and via an inverter 63 monitors the output of comparator 126. The two NAND gates as 60 and 61 are included to indicate that the condition of HHL can be monitored accordingly.

Based on the above discussion, it is impermissible for the output of comparator 130 to be selected when there is an output from comparator 127. As shown in FIG. 4, there is a dashed line which emanates from the FET device 70 associated with comparator 127 which inhibits the FET device 72 associated with comparator 130. This is to merely indicate that upon detection of the HHL condition, as for example by the 3-input NAND gates 60 and the 3-input NAND gate 61, the output of a gate which will enable the output of the comparator 127 also serves to inhibit the output of the comparator 130 or inhibit the NAND gate 60.

As one will ascertain, there are virtually many ways of accomplishing the above-described inhibiting condition. Hence as one can see from the circuit of FIG. 4, the main objective of the present invention is to inhibit an output of a higher order comparator when both the higher order and lower order comparator are exhibiting outputs for a given input signal condition. This of course occurs when the input signal is rapidly slewing. As one can understand, the various comparators should preferably be dynamically matched to about one half a bit measurement.

In any event, due to circuit construction, shunt capacitance and various other aspects, this does not occur. Hence if one comparator did not track another comparator within 2 to 3 percent, a substantial slewing of the input signal at a relatively high rate can cause the above-described errors. It is known that one can employ 3-input NAND gates to detect the HHL pattern which gates can provide multiple outputs due to a fast slewing input. To prevent this, one operates to inhibit higher order comparator outputs with an output from a lower order comparator. As one can immediately ascertain from FIG. 4, there are virtually many ways of accomplishing the result. In regard to selecting the center comparator when an HHL pattern is detected, as for example selecting comparator 130 when comparator 131 is high and comparator 129 is low, this again is a simple logic technique and can be implemented in many ways.

As one can also ascertain from FIGS. 3 and 4 instead of detecting an HHL pattern, one can also detect via 2-input NAND gates an HL pattern and hence look for one transition from high to low indicative of a desired comparator output. By detecting the HHL pattern, one need only utilize 2-input NAND gates and one can sum the outputs of these gates to determine in actuality the true HHL pattern.

The techniques for doing this are well known. In any event, as can be seen from FIG. 4, the exact nature of the decoding is clearly depicted. It is also indicated that each of the comparators as for example comparator 48 indicative of decimal 255 has one input which is coupled to the reference resistance ladder designated by R and another input which is coupled directly to the signal input terminal designated by S. Each of the comparators have such input terminals. It is of course understood by again reviewing FIG. 2 that the permissible range of bits is as indicated in FIG. 2 and for example in regard to the second most significant bit, comparators as for example 64 to 127 would inhibit all outputs from comparators 128 to 256 if the comparators indicative of the second most significant bits were active the same time comparators indicative of the most significant bit were active as explained above.

In this manner one completely eliminates the incorrect decoding to the extent that seriously wrong codes cannot be provided when employing the above techniques. It should be very clear from FIG. 4, that there are numerous ways of inhibiting or enabling outputs of comparators selectively by the use of various NAND gates or exclusive OR gates to thereby effectuate the activation or inhibition of a comparator or a decoded state according to the detected outputs. Essentially, in regard to the above, it is immediately indicated that the flash-converter utilizing the above-described technique will exhibit improved operation over its counterparts when subjected to a fast slewing input signal. The condition due to the erroneous results is sometimes referred to as a "sparkle" condition. The term "sparkle" is derived from the fact that many of the converters of the flash-type are employed to process video signals.

Hence the analog-to-digital conversion essentially is manifested by a series of digital signals each signal representative of a particular pixel. As one can ascertain, the value of the pixel is 8-bit value which represents a level between black and white. In any event, if one for decodes decimal 255, one would achieve an extremely bright value for the pixel at that location. When looking at the television picture, this extremely bright value would look like a "sparkle" or a bright flash at the location. Hence the term "sparkle" has been used to describe the above-noted problem and it is a familiar term in the art.

In any event, as one can ascertain, the entire extent of the present invention relies on the fact that any time a lower reading is detected, at the same time a higher reading is detected one would then inhibit the higher state. As shown in FIG. 2, the various groups of comparators can be split in order to assure proper operation. The present invention considers that such a flash converter or a comparator employed in such a converter would not make errors when there is a substantial difference between output values. Any errors made are relatively close to the correct reading.

Thus the example as shown in FIGS. 3 and 4 is truly indicative of how the error would occur and can occur with a fast input slewing signal. It should be clear to those skilled in the art that the means of inhibiting the appropriate bit based on the above-disclosure are many and there are many alternate schemes which can be implemented. Such schemes which embody the concepts of this invention as well as many alternate structures which can be utilized to perform the above-noted operation are deemed to be covered by the extent and scope of the claims appended hereto.

What is claimed is:

1. In a flash analog-to-digital converter of the type employing $2^n - 1$ comparators where n is a positive integer greater than 1 and selected according to the number of bits converted, each of said comparators having one input coupled to an associated tap on a reference biased resistance ladder and having another input coupled to an analog signal source with said comparators arranged from a lowest decision ordered comparator to a highest decision ordered comparator, where said comparator trip points are spaced one least significant bit apart so that a first plurality of comparators for a given input signal voltage exhibit a high output, while a second plurality exhibits a low output for the same given input voltage, whereby one of said comparators in said plurality has a high output with a lower least significant bit adjacent comparator having a low output and a higher least significant bit adjacent comparator having a high output so that said one comparator output is the desired selected output of said converter, whereby if said analog signal source is slewing rapidly more than one comparator in said plurality will undesirably provide an output due to adjacent comparators exhibiting high and low outputs, the combination therewith of apparatus for preventing such multiple outputs in a flash-type converter, comprising:
   means coupled to selected comparator outputs for detecting all the comparator output states for a given input signal voltage to determine the comparators providing said high output and the comparators providing said low output; and
   means coupled to said comparators for inhibiting any output from a comparator of a higher decision order when a lower decision order comparator is also providing said output, whereby only one lower order comparator will provide an output for said given input signal voltage.

2. The apparatus according to claim 1, wherein said means coupled to said comparator outputs includes a plurality of three input AND gate means each operative to detect a high, high-low pattern (HHL), with the output of said AND gates associated with lower order comparators operative to inhibit outputs of higher order comparators.

3. The apparatus according to claim 1, wherein said means coupled to said comparator outputs includes a plurality of AND gate means each operative to detect a high-low pattern (HHL), with the output of said AND gates associated with lower order comparators operative to inhibit the output of high order comparators.

4. The apparatus according to claim 2, wherein said AND gate means are NAND gates.

5. The apparatus according to claim 3, wherein said AND gate means are NAND gates.

6. The apparatus according to claim 1, wherein said plurality of comparators are arranged in groups with a first group of inhibiting detecting comparators and a second group of non-inhibiting detecting comparators whereby only said first group of comparators are selected to be coupled to said means for detecting.

7. The apparatus according to claim 1, wherein said converter is an 8-bit converter having 255 comparators with a first comparator being the lowest decision ordered comparator and the 255th comparator of said 255 comparators being the highest decision ordered comparator.

8. A method for error prevention in a flash type analog-to-digital converter of the type employing a plurality of comparators with said comparators arranged from a lowest decision ordered comparator to a highest decision ordered comparator, each having one input coupled to an associated tap on a resistance reference ladder and each having another input adapted to be coupled to an analog input signal source for providing an output indicative of the value of said signal by determining the comparator output tap where all comparisons above and adjacent to said tap are high and all comparisons below and adjacent to said tap are low such that said determined output is high to thereby provide said output by testing for a high, high-low (HHL) sequence whereby if said input signal is slewing rapidly more than one HHL sequence will be undesirably provided, comprising the steps of:

detecting all HHL sequences, inhibiting any higher order detected sequences with a detected lower order sequence to thereby prevent more than one sequence from being provided and using said detected lower sequence for determining said desired comparator output.

9. The method according to claim 8, wherein the step of detecting includes detecting all high-low sequences by means of AND gating circuits to determine said HHL sequences.

10. The method according to claim 8, wherein the step of detecting includes detecting a high significant bit associated with one of said HHL sequences then detecting a lower significant bit associated with a lower order HHL sequence and inhibiting said high significant bit with said lower significant bit as detected.

11. The method according to claim 10, wherein said high significant bit is the most significant bit and said lower significant bit is the second most significant bit.

12. The method according to claim 10, wherein said high significant bit is the second most significant bit and said lower significant bit is the third most significant bit.

13. The method according to claim 8, further including the steps of:

placing selected comparators in at least one inhibit group selected according to their order in said converter, and employing only those outputs in said inhibit group for implementing said step of inhibiting, with said comparators not selected placed in a non-inhibiting group.

14. The method according to claim 13, wherein said comparators placed in said inhibit group have an output inhibiting line $B_{INH}$, and those placed in said non-inhibiting group have an output non-inhibiting line $B_{NON}$, where the desired comparator output $B_{OUT}$ for n bits is determined according to the following equation:

$$B_{OUT}(n) = [B_{NON}(n) + B_{INH}(n)] \cdot B_{INH}(n-1)$$

15. The method according to claim 14, wherein n is equal to 8.

16. The method according to claim 8, wherein said converter is an 8-bit converter having 255 comparators.

17. The method according to claim 16, wherein said selected comparators are placed in first and second inhibiting groups according to the third most significant bit associated with said comparators to implement the step of inhibiting the second most significant bit associated with higher order comparators.

18. The method according to claim 16, wherein said selected comparators are placed in four inhibiting groups according to the fourth most significant bit associated with said comparators to implement the step of inhibiting the third most significant bit associated with higher order comparators.

* * * * *